United States Patent
Shin et al.

(10) Patent No.: US 11,257,979 B2
(45) Date of Patent: Feb. 22, 2022

(54) DISPLAY APPARATUS AND MANUFACTURING METHOD THEREOF

(71) Applicant: SAMSUNG ELECTRONICS CO., LTD., Suwon-si (KR)

(72) Inventors: Sang Min Shin, Suwon-si (KR); Oh Jae Kwon, Suwon-si (KR); Ho Seop Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/763,079

(22) PCT Filed: Nov. 9, 2018

(86) PCT No.: PCT/KR2018/013611
§ 371 (c)(1),
(2) Date: May 11, 2020

(87) PCT Pub. No.: WO2019/093812
PCT Pub. Date: May 16, 2019

(65) Prior Publication Data
US 2020/0350464 A1 Nov. 5, 2020

(30) Foreign Application Priority Data

Nov. 10, 2017 (KR) .................. 10-2017-0149449

(51) Int. Cl.
*H01L 21/00* (2006.01)
*H01L 33/00* (2010.01)
(Continued)

(52) U.S. Cl.
CPC .......... *H01L 33/0095* (2013.01); *H01L 22/22* (2013.01); *H01L 25/0753* (2013.01);
(Continued)

(58) Field of Classification Search
CPC . H01L 33/0095; H01L 22/22; H01L 25/0753; H01L 25/167; H01L 27/1214;
(Continued)

(56) References Cited

U.S. PATENT DOCUMENTS

2015/0001478 A1 1/2015 Choi et al.
2017/0294565 A1 10/2017 Kim
(Continued)

FOREIGN PATENT DOCUMENTS

JP 2015-173244 A 10/2015
KR 10-2013-0053280 A 5/2013
(Continued)

OTHER PUBLICATIONS

Communication dated Nov. 20, 2020, issued by the European Patent Office in counterpart European Application No. 18875512.8.
(Continued)

*Primary Examiner* — Ismail A Muse
(74) *Attorney, Agent, or Firm* — Sughrue Mion, PLLC

(57) ABSTRACT

The present disclosure relates to a display apparatus including a substrate, a thin film transistor disposed on the substrate, a first insulating layer disposed on a source electrode and a drain electrode of the thin film transistor, a light emitting diode disposed on the first insulating layer to emit light toward the substrate, a second insulating layer disposed on the first insulating layer to surround the light emitting diode, an upper electrode disposed on the second insulating layer, and a driver IC chip disposed above the upper electrode to be connected to the upper electrode. According to the above configuration, the driver IC chip is disposed on the back side of a light emitting surface of a display panel, so that a bezel is capable of being minimized or omitted, and manufacturing of the display apparatus is easy and manufacturing costs is reduced.

15 Claims, 18 Drawing Sheets

(51) Int. Cl.
*H01L 21/66* (2006.01)
*H01L 25/075* (2006.01)
*H01L 25/16* (2006.01)
*H01L 27/12* (2006.01)
*H01L 29/786* (2006.01)
*H01L 33/62* (2010.01)

(52) U.S. Cl.
CPC ........ *H01L 25/167* (2013.01); *H01L 27/1214* (2013.01); *H01L 29/78633* (2013.01); *H01L 33/62* (2013.01); *H01L 2933/0066* (2013.01)

(58) Field of Classification Search
CPC ............... H01L 29/78633; H01L 33/62; H01L 2933/0066; H01L 25/075; H01L 33/48
See application file for complete search history.

(56) References Cited

U.S. PATENT DOCUMENTS

| | | | |
|---|---|---|---|
| 2017/0336690 A1* | 11/2017 | Lee | H01L 25/0753 |
| 2018/0006058 A1* | 1/2018 | Lee | H01L 27/1218 |
| 2019/0206848 A1* | 7/2019 | Lee | H01L 25/0753 |
| 2020/0013838 A1* | 1/2020 | Takechi | H01L 51/5234 |
| 2020/0075823 A1* | 3/2020 | Yang | H01L 27/156 |
| 2020/0411492 A1* | 12/2020 | Ju | H01L 33/44 |

FOREIGN PATENT DOCUMENTS

| | | |
|---|---|---|
| KR | 10-2015-0044336 A | 4/2015 |
| KR | 10-2016-0098606 A | 8/2016 |
| KR | 10-2017-0116633 A | 10/2017 |
| KR | 10-1860036 B1 | 6/2018 |
| WO | 2014/149864 A1 | 9/2014 |

OTHER PUBLICATIONS

Communication dated Mar. 8, 2019 issued by the International Searching Authority in counterpart Application No. PCT/KR2018/013611 (PCT/ISA/210).

Communication dated Feb. 24, 2021, issued by the European Patent Office in counterpart European Application No. 18875512.8.

* cited by examiner

DISPLAY APPARATUS AND MANUFACTURING METHOD THEREOF

TECHNICAL FIELD

The present disclosure relates to a display apparatus displaying an image using a light emitting diode and a manufacturing method thereof.

BACKGROUND ART

A display apparatus is an apparatus that converts and displays electrical information into visual information. The display apparatus may include not only televisions and monitors, but also portable devices such as notebook PCs, smart phones, and tablet PCs.

The display apparatus may include a light-receiving display panel, such as used in a liquid crystal display (LCD), or a self-light emitting display panel generating light corresponding to a data signal.

In particular, research into light emitting diodes (LEDs) has been actively conducted to implement the self-light emitting display panel. The light emitting diodes, which are devices that convert an electrical signal into a form of light such as infrared light or visible light by using the properties of a compound semiconductor, are used not only for home appliances, remote controls, electronic displays, and various automation devices, but are also increasingly used in small handheld electronic devices and large display devices.

DISCLOSURE

Technical Problem

The present disclosure is directed to providing a display apparatus minimizing a bezel by moving a driver IC region located at an edge of a display panel to the back side of a light emitting surface of the display panel and a manufacturing method thereof.

Technical Solution

One aspect of the present disclosure provides a display apparatus including a substrate, a thin film transistor disposed on the substrate and including a semiconductor active layer, a gate electrode, a source electrode, and a drain electrode, a first insulating layer disposed on the source electrode and the drain electrode, a light emitting diode disposed on the first insulating layer to emit light toward the substrate and including a p-n diode, an anode, and a cathode, a second insulating layer disposed on the first insulating layer to surround the light emitting diode, an upper electrode disposed on the second insulating layer, and a driver IC chip disposed above the upper electrode to be connected to the upper electrode.

The thin film transistor and the light emitting diode may be disposed not to overlap each other.

The substrate may include a light emitting region in which the light emitting diode is disposed and a non-light emitting region in which the thin film transistor is disposed.

The display apparatus may further include a light absorbing layer disposed in the non-light emitting region.

The gate electrode may be disposed above the semiconductor active layer.

The light emitting diode may be individually or plurally picked up on a wafer by a transfer mechanism and transferred to the first insulating layer.

The light emitting diode may be fixed on the first insulating layer by an adhesive coating.

The light emitting diode may include a light emitting surface, and the light emitting surface may be in contact with the first insulating layer.

The anode and the cathode may be positioned on an upper surface of the light emitting diode.

The IC chip may be connected to the upper electrode by an ACF bonding.

The display apparatus may further include an upper insulating layer disposed on the upper electrode.

The display apparatus may further include a color conversion layer disposed below the light emitting diode.

Another aspect of the present disclosure provides a display apparatus including a substrate in which a plurality of scan lines arranged in a first direction to transmit a scan signal, and a plurality of data lines arranged in a second direction different from the first direction to transmit a data signal, and a sub-pixel region formed in an intersection region of the scan lines and the data lines are provided on one surface thereof, and a light emitting diode disposed on the sub-pixel region to emit light toward the substrate and including a p-n diode, an anode, and a cathode, wherein the sub-pixel region includes an disposition region in which the light emitting diode is disposed, a repair region in which a repair light emitting diode to replace the light emitting diode is disposed, a signal electrode to supply the data signal to the light emitting diode, a common ground electrode to provide ground to the light emitting diode and the repair light emitting diode, and a repair signal electrode to supply the data signal to the repair light emitting diode.

The anode of the repair light emitting diode and the repair signal electrode may be connected by a metal ink.

The cathode of the repair light emitting diode and the common ground electrode may be connected by a metal ink.

The common ground electrode may be provided between the disposition region and the repair region.

Another aspect of the present disclosure provides a method of manufacturing a display apparatus including forming a pixel circuit including a thin film transistor on a substrate, disposing a light emitting diode on the substrate to emit light toward the substrate, forming a signal electrode to supply a data signal to the light emitting diode, a common ground electrode to provide ground to the light emitting diode and a repair light emitting diode, and a repair signal electrode to supply a data signal to the repair light emitting diode, and performing a lighting test of the light emitting diode.

The method of manufacturing the display apparatus may further include disposing the repair light emitting diode in a repair region when the lighting test fails.

The method of manufacturing the display apparatus may further include connecting the repair light emitting diode to the repair signal electrode and the common ground electrode through a metal ink.

The method of manufacturing the display apparatus may further include cutting the signal electrode connected to an anode of the light emitting diode that fails to light.

Advantageous Effects

According to a disclosed display apparatus and a manufacturing method thereof, because a driver IC chip is disposed on the back side of a light emitting surface of a substrate, a bezel can be minimized or omitted. Accordingly, a large-sized display apparatus can be effectively configured by tiling small-sized module display panels.

Because a general substrate is used instead of a TGV (Through Glass Via) substrate and a conventional thin film transistor (TFT) process is used, manufacturing is easy and manufacturing costs can be reduced.

The durability, color reproducibility and luminance of the display apparatus can be improved by using a micro LED instead of an organic light emitting diode.

MODE OF THE INVENTION

Figure 1:
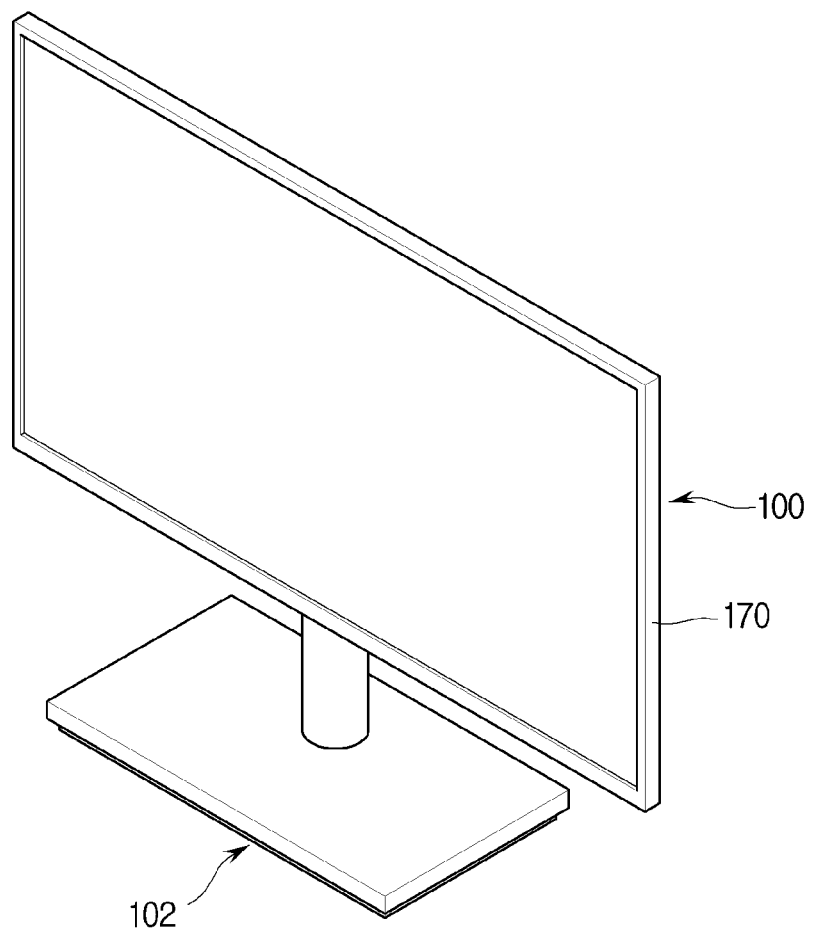
FIG. 1 illustrates an outer appearance of a display apparatus according to an embodiment of the present disclosure.

The embodiments described in the present specification and the configurations shown in the drawings are only examples of preferred embodiments of the present disclosure, and various modifications may be made at the time of filing of the present disclosure to replace the embodiments and drawings of the present specification.

Singular expressions used in the description may include plural expressions, unless the context clearly dictates otherwise. The shape and size of elements in the drawings may be exaggerated for clarity. Like reference numbers or signs in the various drawings of the application represent parts or components that perform substantially the same functions.

The terms "comprises" and "has" are intended to indicate that there are features, numbers, steps, operations, elements, parts, or combinations thereof described in the specification, and do not exclude the presence or addition of one or more other features, numbers, steps, operations, elements, parts, or combinations thereof.

It will be understood that, although the terms first, second, etc. may be used herein to describe various components, these components should not be limited by these terms.

Hereinafter, embodiments of the present disclosure will be described in detail with reference to the accompanying drawings.

FIG. 1 illustrates an outer appearance of a display apparatus according to an embodiment of the present disclosure.

Figure 2:
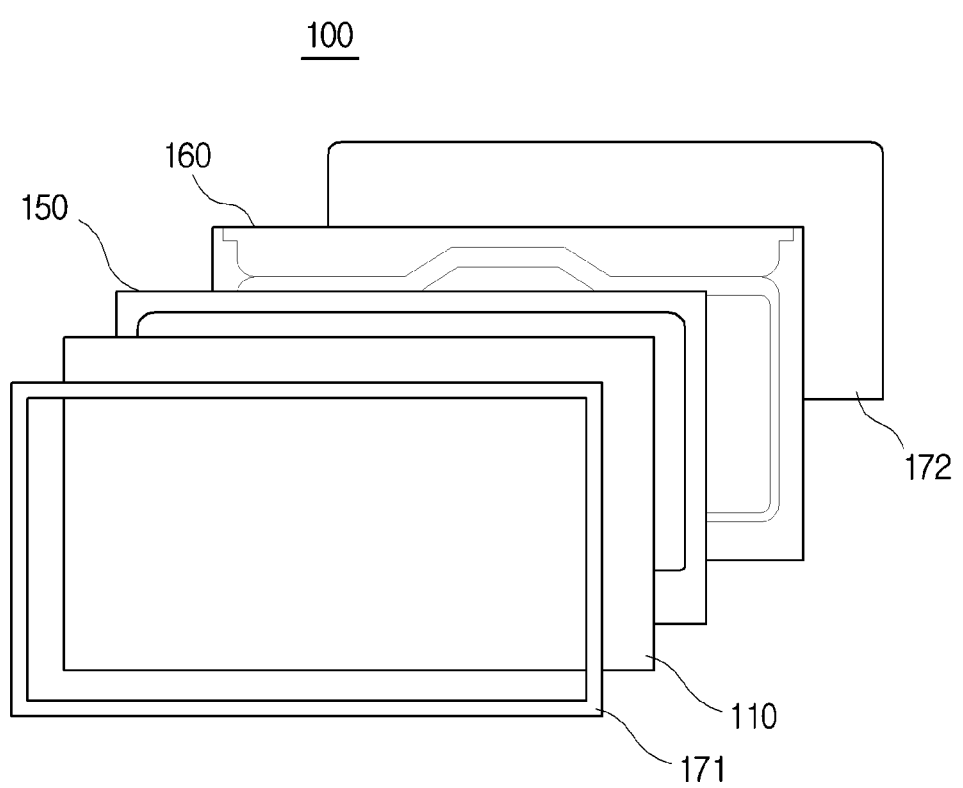
FIG. 2 is an exploded perspective view of the display apparatus according to an embodiment of the present disclosure.
Figure 3:
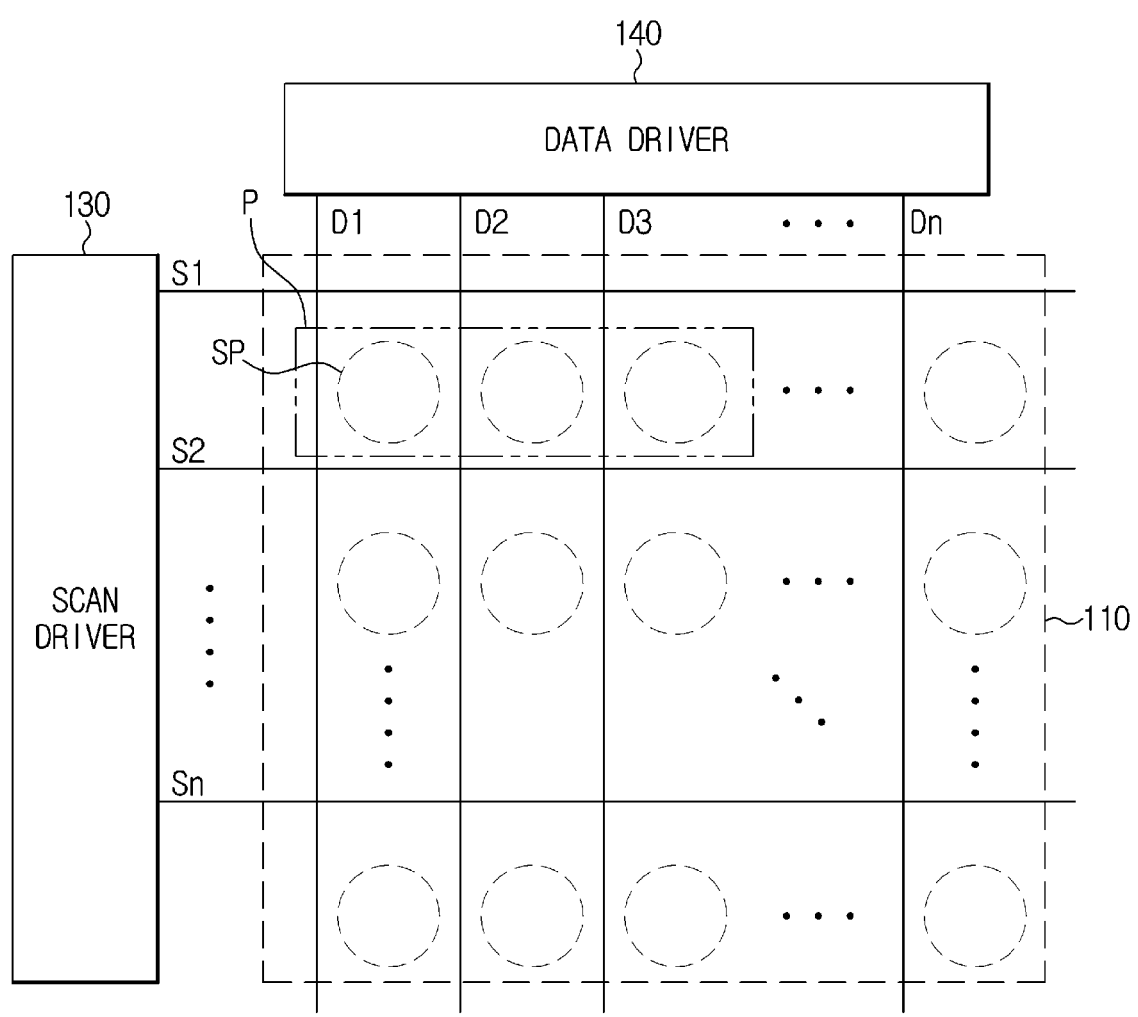
FIG. 3 is a schematic diagram of the configuration of a display panel according to an embodiment of the present disclosure.
Figure 4:
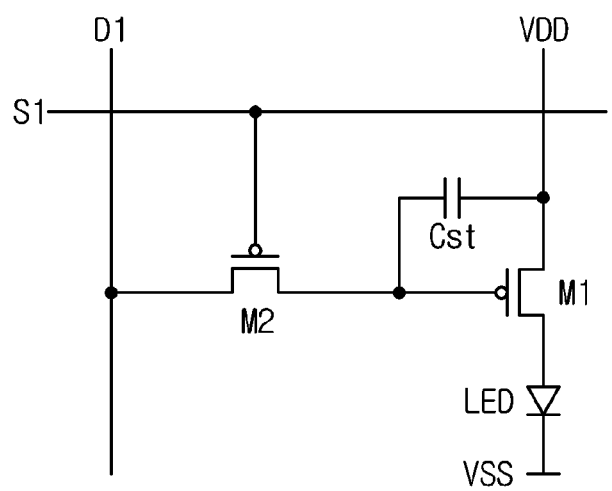
FIG. 4 is a diagram illustrating a circuit diagram of a sub-pixel circuit provided in a sub-pixel region of the display panel in FIG. 3.

FIG. 2 is an exploded perspective view of the display apparatus according to an embodiment of the present disclosure. FIG. 3 is a schematic diagram of the configuration of a display panel according to an embodiment of the present disclosure. FIG. 4 is a diagram illustrating a circuit diagram of a sub-pixel circuit provided in a sub-pixel region of the display panel in FIG. 3. FIGS. 5 to 10 are cross-sectional views of one sub-pixel region of the display panel according to an embodiment of the present disclosure, sequentially illustrating in a stacking sequence. FIG. 11 is a cross-sectional view of one sub-pixel region of a display panel according to another embodiment of the present disclosure.

A display apparatus 100 may display an electrical signal received from the outside as an image. Specifically, the display apparatus 100 may control colors of each of a plurality of pixels in a predetermined display region, so that a user may recognize the display region as one image.

FIG. 1 illustrates a case where the display apparatus 100 is supported by a stand 102 mounted on a lower end thereof. Alternatively, the display apparatus 100 may be installed on a wall by a bracket or the like.

Referring to FIG. 2, the display apparatus 100 may include a display panel 110, a support member 150, a chassis 160, and a housing 170.

The housing 170 forms an outer appearance of the display apparatus 100 and may include a bezel 171 and a cover 172. The bezel 171 and the cover 172 may be combined with each other to form an accommodation space. The display panel 110, the support member 150, the chassis 160, and like may be disposed in the accommodation space.

The support member 150 may support the display panel 110 and the chassis 160 disposed between the bezel 171 and the cover 172. To this end, the support member 150 is detachably coupled to the bezel 171 to fix the display panel 110 and the chassis 160.

The chassis 160 may connect various parts necessary for image display and sound output. That is, various printed circuit boards, input/output devices, and the like may be provided on the chassis 160. The chassis 160 may be formed of a metal material having excellent heat dissipation and strength.

The display panel 110 allows a user to visually recognize an image. The display panel 110 may refer to a panel that emits light of a frequency corresponding to an image signal received from the outside or generated inside the display apparatus 100.

Referring to FIG. 3, a plurality of data lines D1 to Dm, a plurality of scan lines S1 to Sn arranged in a row direction, and a plurality of sub-pixel regions SP formed adjacent to intersection points of the data lines D1 to Dm and the scan lines S1 to Sn may be provided on one surface of the display panel 110. A sub-pixel circuit may be provided in each of the sub-pixel regions SP. At least three of the sub-pixel regions SP adjacent to each other among the plurality of sub-pixel regions SP may constitute a pixel region P.

The data lines D1 to Dm may transmit a data signal representing an image signal to a sub-pixel circuit in the sub-pixel region SP, and the scan lines S1 to Sn may transmit a scan signal to the sub-pixel circuit in the sub-pixel region SP.

A scan signal may be sequentially applied to each of the scan lines S1 to Sn by a scan driver 130, and a data voltage VDATA corresponding to the image signal may be applied to each of the data lines D1 to Dm by a data driver 140.

According to an embodiment of the present disclosure, the scan driver 130 and the data driver 140 may be mounted above a substrate 111 of the display panel. Accordingly, the bezel (a lateral width surrounding the pixel region) of the display panel 110 is minimized or omitted, so that an entire front surface of the display panel 110 may become a pixel region.

FIG. 4 is an equivalent circuit diagram illustrating a sub-pixel circuit in the sub-pixel region SP in FIG. 3. Specifically, FIG. 4 illustrates a sub-pixel circuit driven by the first scan line S1 and the first data line D1.

Referring to FIG. 4, the sub-pixel circuit may include a light emitting diode LED, two of transistors M1 and M2, and a capacitor Cst. The plurality of transistors M1 and M2 may be implemented as PMOS type transistors. However, such a circuit configuration is only an example of the sub-pixel circuit, and is not limited to the circuit configuration of FIG. 4.

A gate electrode of the switching transistor M2 may be connected to the scan line Sn, a source electrode thereof may be connected to the data line Dm, and a drain electrode thereof may be connected to one end of the capacitor Cst and a gate electrode of the driving transistor M1, and the other end of the capacitor Cst may be connected to a power supply voltage VDD. A source electrode of the driving transistor M1 may be connected to the power supply voltage VDD, a drain electrode thereof may be connected to an anode 310 of the light emitting diode LED, and a cathode 320 of the light emitting diode LED may be connected to a reference voltage VSS, thereby emitting light based on current applied from the driving transistor M1.

The reference voltage VSS connected to the cathode 320 of the light emitting diode LED is a voltage at a level lower than the power supply voltage VDD, and a ground voltage or the like may be used.

The operation of the sub-pixel circuit is as follows. First, when a scan signal is applied to the scan line Sn so that the switching transistor M2 is turned on, a data voltage may be transmitted to one end of the capacitor Cst and the gate electrode of the driving transistor M1. As a result, a gate-source voltage VGS of the driving transistor M1 may be maintained for a certain period by the capacitor Cst. In addition, the driving transistor M1 may emit the light emitting diode LED by applying a current ILED corresponding to the gate-source voltage VGS to the anode 310 of the light emitting diode LED.

At this time, when the data voltage VDATA of a high level is transmitted to the gate electrode of the driving transistor M1, the gate-source voltage VGS of the driving transistor M1 is decreased, and a small amount of the current ILED is applied to the anode 310 of the light emitting diode LED, so that the light emitting diode LED may emit a small amount of light to display a low-level gradation. On the other hand, when the data voltage VDATA of a low level is transmitted, the gate-source voltage VGS of the driving transistor M1 is increased, and a large amount of the current ILED is applied to the anode 310 of the light emitting diode LED, so that the light emitting diode LED may emit a large amount of light to display a high-level gradation. As such, the level of the data voltage VDATA applied to each of the sub-pixel circuits may be determined based on an image to be displayed.

The sub-pixel region P may be formed by a method as illustrated in FIGS. 5 to 10.

Figure 5:
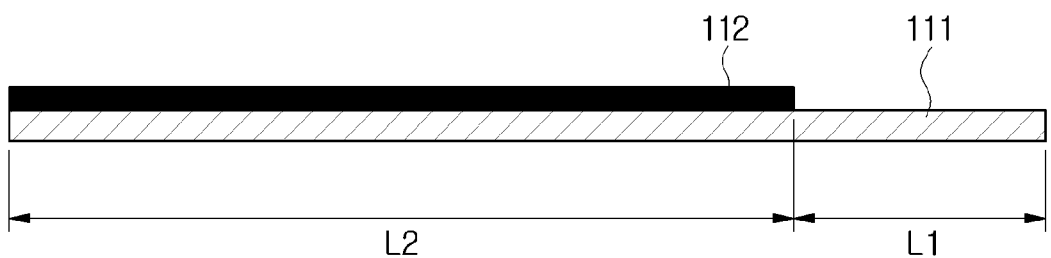
FIGS. 5 to 10 are cross-sectional views of one sub-pixel region of the display panel according to an embodiment of the present disclosure, sequentially illustrating in a stacking sequence.

As illustrated in FIG. 5, the substrate 111 is prepared, and a light absorbing layer 112 is formed on the substrate 111.

The substrate 111 may be formed of various materials. For example, the substrate 111 may be made of a transparent glass material based on SiO2. However, the substrate 111 is not necessarily limited thereto, and may be formed of a transparent plastic material to have flexibility. The plastic material is selected from a group consisting of polyethersulphone (PES), polyacrylate (PAR, polyacrylate), polyetherimide (PEI), polyethyelenen napthalate (PEN), polyethyeleneterepthalate (PET), polyphenylene sulfide (PPS), polyallylate, polyimide, polycarbonate (PC), cellulose tri acetate (TAC), and cellulose acetate propionate (CAP), which are insulating organic materials.

According to an embodiment of the present disclosure, the display panel 110 is a bottom emission type, and the substrate 111 may be formed of a transparent material.

The substrate 111 may include a light emitting region L1 in which a light emitting diode 300 is disposed so that light emits, and a non-light emitting region L2 in which a circuit element such as a thin film transistor 200 is disposed so that light does not emit. The light absorbing layer 112 for improving visibility by absorbing external light may be formed on the non-light emitting region L2 of the substrate 111.

The light absorbing layer 112 may include a black inorganic material, a black organic material, or a black metal, which absorb light well.

For example, the light absorbing material may be formed of carbon black, polyene-based pigments, azo-based pigments, azomethine-based pigments, diimmonium-based pigments, phthalocyanine-based pigments, quinone-based pigments, indigo-based pigments, thioindigo-based pigments, dioxadin-based pigments, quinacridone-based pigments, isoindolinone-based pigments, a metal oxide, a metal complex, or other materials such as aromatic hydrocarbon.

Figure 6:
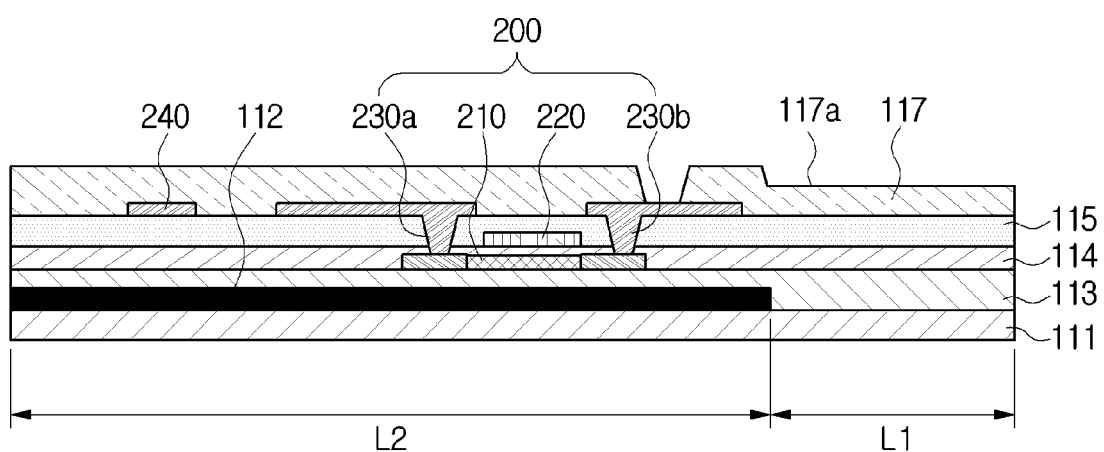

As illustrated in FIG. 6, a buffer layer 113 may be formed on the substrate 111. The buffer layer 113 may provide a flat surface on the upper portion of the substrate 111 and block foreign matters or moisture from penetrating through the substrate 111. For example, the buffer layer 113 may contain inorganic materials such as silicon oxide, silicon nitride, silicon oxynitride, aluminum oxide, aluminum nitride, titanium oxide and titanium nitride, or organic materials such as polyimide, polyester and acrylic, and may be formed of a plurality of laminates among the illustrated materials.

The thin film transistor 200 and the light emitting diode 300 may be provided on the buffer layer 113.

The transistor 200 may include a semiconductor active layer 210, a gate electrode 220, a source electrode 230a, and a drain electrode 230b. The semiconductor active layer 210 may include a semiconductor material and may have a source region, a drain region, and a channel region between the source region and the drain region. The gate electrode 220 may be formed on the semiconductor active layer 210 to correspond to the channel region. The source electrode 230a and the drain electrode 230b may be electrically connected to the source region and the drain region of the semiconductor active layer 210, respectively.

A gate insulating layer 114 may be disposed between the semiconductor active layer 210 and the gate electrode 220. The gate insulating layer 114 may be formed of an inorganic insulating material.

An interlayer insulating layer 115 may be disposed between the gate electrode 220 and the source electrode 230a and between the gate electrode 220 and the drain electrode 230b. The interlayer insulating layer 115 may be formed of an organic insulating material or an inorganic insulating material, or may be formed by alternating the organic insulating material and the inorganic insulating material. A power supply voltage (VDD) 240 may be disposed on the interlayer insulating layer 155.

A first insulating layer 117 is disposed as a planarization layer on the source electrode 230a and the drain electrode 230b. The first insulating layer 117 may be formed of an organic insulating material or an inorganic insulating material, or may be formed by alternating the organic insulating material and the inorganic insulating material.

An embodiment of the present disclosure illustrates that the thin film transistor 200 is implemented as a top gate type in which the gate electrode 220 is disposed above the semiconductor active layer 210, but the present disclosure is not limited thereto, and the gate electrode 220 may be disposed below the semiconductor active layer 210.

The first insulating layer 117 may have a concave portion 117a concavely formed to accommodate the light emitting diode 300. However, the present disclosure is not limited thereto, and the first insulating layer 117 may be formed to be flat so that the concave portion 117a is not formed.

A depth of the concave portion 117a may be determined by a height and a viewing angle of the light emitting diode 300. According to an embodiment of the present disclosure, the concave portion 117a is recessed to have a substantially rectangular shape, but is not limited thereto, and may have various shapes such as a triangle, a circle, a cone, and an oval.

Figure 7:
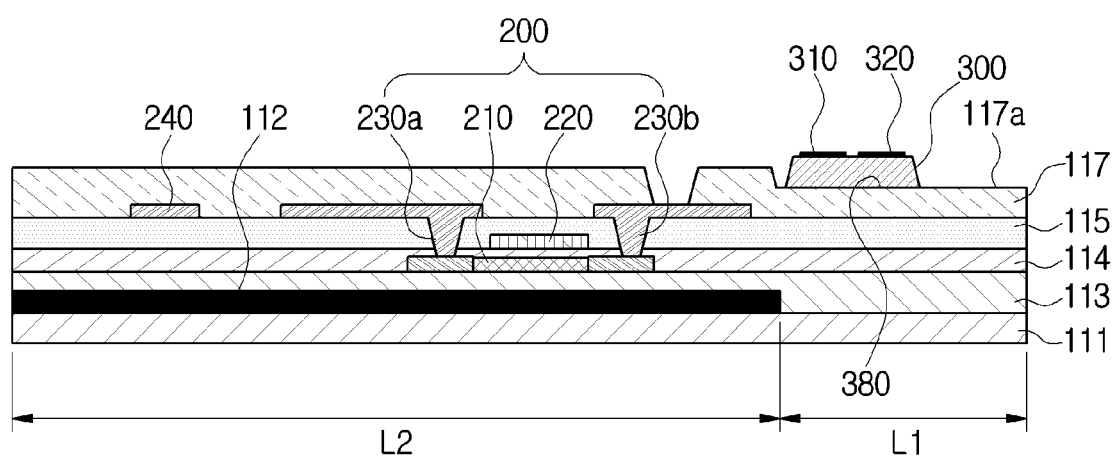

As illustrated in FIG. 7, the light emitting diode 300 may be disposed on the concave portion 117a of the first insulating layer 117. According to an embodiment of the present disclosure, the light emitting diode 300 may be a micro LED. The micro may point to a size of 1 to 100 μm, but the present disclosure is not limited thereto, and may be applied to a light emitting diode having a size larger or smaller than that.

The micro LED may be individually or plurally picked up on a wafer by a transfer mechanism and transferred to the substrate 111. Because such a micro LED is composed of an inorganic material, the micro LED has a faster reaction speed than an organic light emitting diode (OLED) using an organic material, and may support low power and high luminance. In addition, the organic light emitting diode is vulnerable to moisture and oxygen exposure and thus requires an encapsulation process and has poor durability, but the micro LED does not require the sealing process itself and has excellent durability.

The light emitting diode 300 may emit light of a predetermined wavelength belonging to a wavelength region from ultraviolet light to visible light. For example, the light emitting diode 300 may be a red, green, blue and white LEDs, or an UV LED. That is, the red LED, green LED, and blue LED are disposed in the adjacent sub-pixel regions SP, respectively, and three of the adjacent sub-pixel regions SP may form one of the pixel region P. One color may be determined by mixing red light, green light, and blue light generated in one of the pixel region P.

The light emitting diode 300 may include a p-n diode, the anode 310 and the cathode 320. The anode 310 and/or cathode 320 may be formed of a variety of conductive materials, including metals, conductive oxides, and conductive polymers. The anode 310 may be electrically connected to a signal electrode 510, and the cathode 320 may be electrically connected to a common ground electrode 530. The p-n diode may include a p-doped portion on the anode 310 side, one or more quantum well portions, and an n-doped portion on the cathode 320 side. Alternatively, the doped portion on the cathode 320 side may be a p-doped portion, and the doped portion on the anode 310 side may be an n-doped portion.

The anode 310 and the cathode 320 may be positioned on an upper surface of the light emitting diode 300. Conversely, a light emitting surface 380 of the light emitting diode 300 may be positioned on a lower surface of the light emitting diode 300. Accordingly, the light emitting surface 380 of the light emitting diode 300 may be in contact with the first insulating layer 117, and the light emitting diode 300 may emit light toward the substrate 111. That is, according to an embodiment of the present disclosure, the light emitting diode 300 may be a bottom emission type. Because the light emitting diode 300 is a bottom emission type, a pixel circuit element such as the thin film transistor 200 and the light emitting diode 300 are disposed not to overlap each other in the up-down direction. The light emitting diode 300 may be fixed on the first insulating layer 117 by an adhesive coating.

Figure 8:
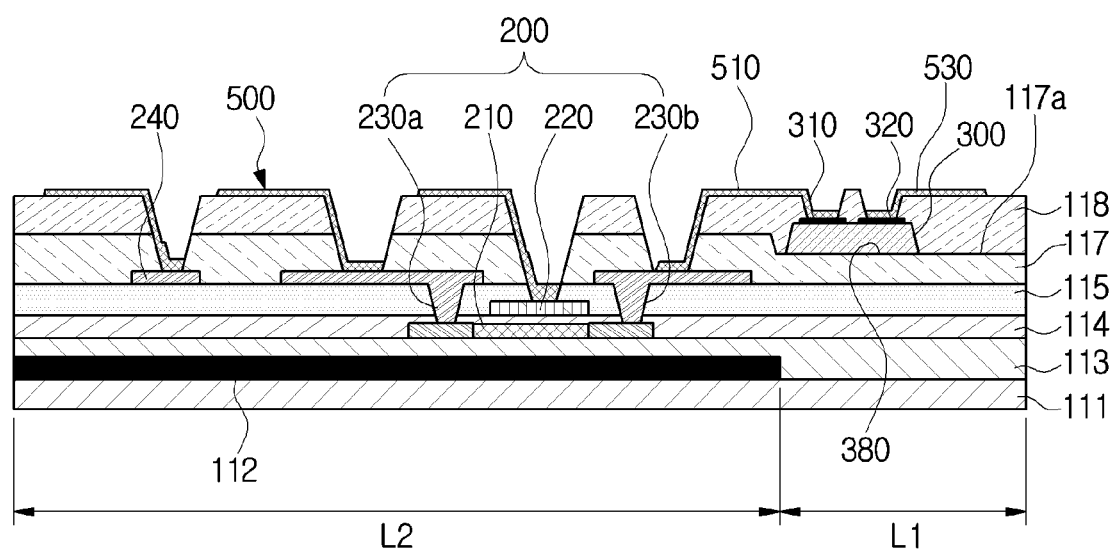

As illustrated in FIG. 8, a second insulating layer 118 may be provided on the first insulating layer 117 to surround the light emitting diode 300. The second insulating layer 118 may be formed to correspond to the shape of the concave portion 117a. The second insulating layer 118 may include an organic insulating material. For example, the second insulating layer 118 may be formed of acrylic, poly methyl methacrylate (PMMA), benzocyclobutene (BCB), polyimide, acrylate, epoxy, and polyester, but is not limited thereto.

An upper electrode 500 may be disposed on the second insulating layer 118. The upper electrode 500 may connect various driver IC chips for driving the display panel 110 to the pixel circuit. For example, the driver IC chips may include a power line 551, a data IC 552, a gate IC 553, a reference voltage VSS 554, a touch sensing IC, a wireless controller, a communication IC, and the like. The upper electrode 500 may be formed to correspond to the shape of the concave portion 117a.

The upper electrode 500 may include the signal electrode 510 connecting the drain electrode 230b of the thin film transistor 200 and the anode 310 of the light emitting diode 300 to apply a data signal to the light emitting diode 300, and the common ground electrode 530 connecting the cathode 320 of the light emitting diode 300 and the reference voltage VSS 554 to provide ground to the light emitting diode 300.

A lighting test of the light emitting diode 300 may be performed after the upper electrode 500 is disposed as described above, and when lighting of the light emitting diode 300 fails, a repair light emitting diode 700 (FIGS. 16 and 17) may be disposed in a repair region. The disposition of the repair light emitting diode 700 will be described later.

Figure 9:
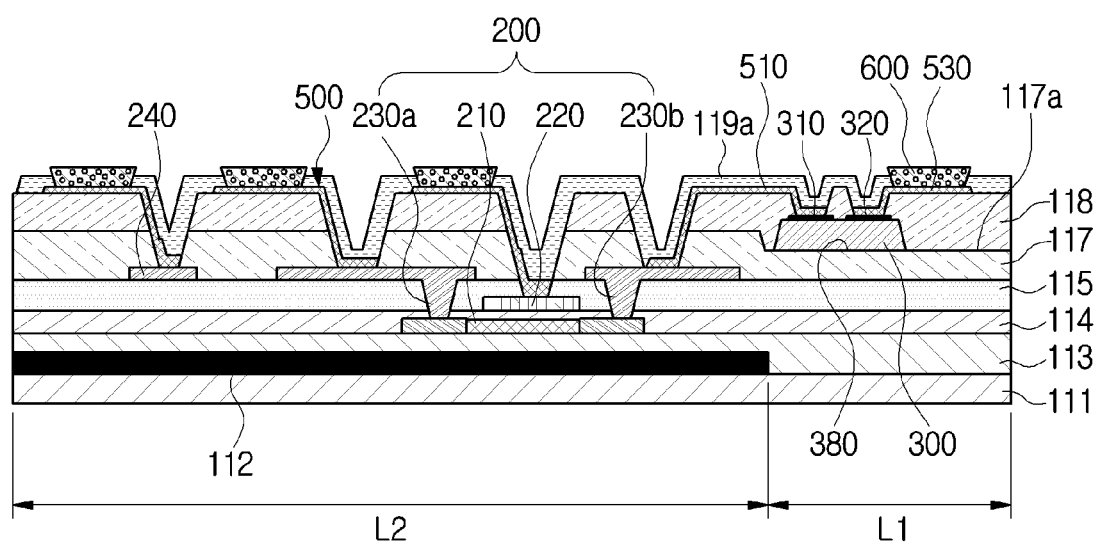
Figure 10:
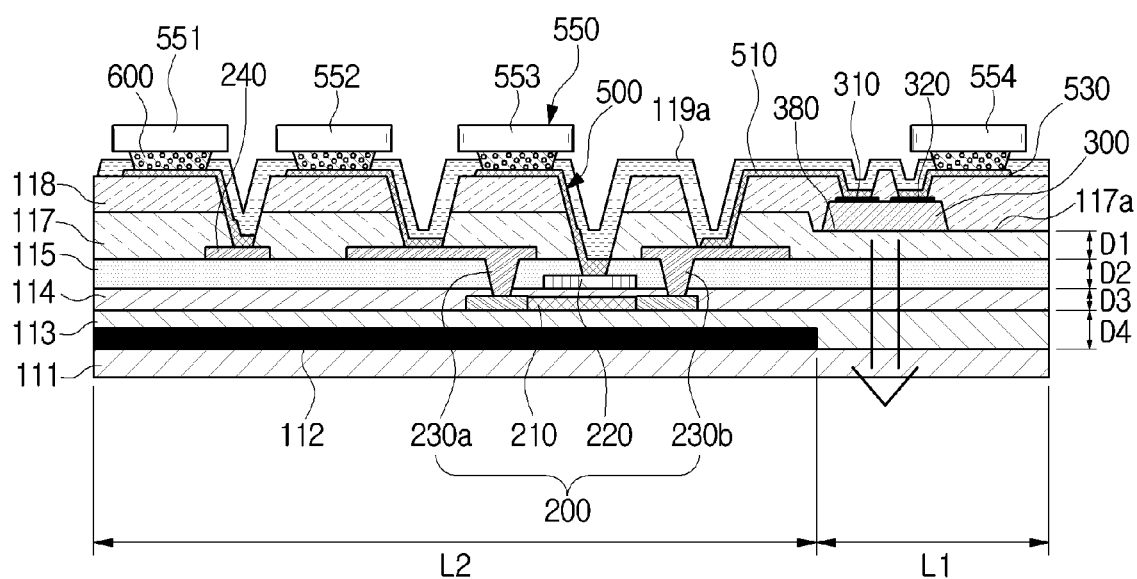
Figure 11:
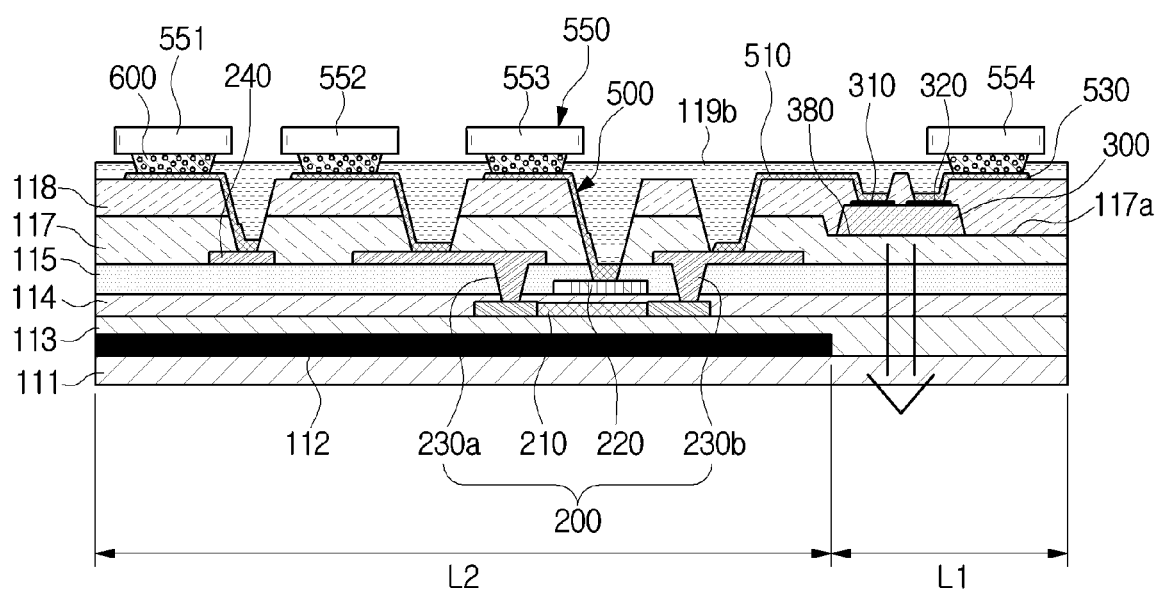
FIG. 11 is a cross-sectional view of one sub-pixel region of a display panel according to another embodiment of the present disclosure.

As illustrated in FIGS. 9 and 10, an upper insulating layer 119a may be formed on the upper electrode. The upper insulating layer 119a may be formed of an inorganic insulating material. However, as illustrated in FIG. 11, when an upper insulating layer 119b is formed of an organic insulating material, an upper surface thereof may be formed flat.

Various driver IC chips for driving the display panel 110, for example, the power line 551, the data IC 552, the gate IC 553, the reference voltage VSS 554, the touch sensing IC, the wireless controller, a communication IC and the like are disposed above the upper electrode 500, and may be electrically connected to the upper electrode 500 by anisotropic conductive film (ACF) bonding.

After the ACF is disposed on the upper electrode 500, the driver IC chips are in close contact with the ACF, and the temperature and viscosity of the ACF through a laser beam or the like are changed, so that the upper electrode 500 and the driver IC chips may be bonded.

According to the above structure, without forming a separate via hole in the substrate 111, the pixel circuit and various driver IC chips may be connected through the upper electrode 500, and the driver IC chips may be disposed on the back side of the light emitting surface of the substrate 111.

Because the light emitting diode 300 is a bottom emission type, the first insulating layer 117, the interlayer insulating layer 115, the gate insulating layer 114, and the buffer layer 113 are all formed of a transparent material, and light transmission efficiency may be maximized by appropriately designing thicknesses D1, D2, D3, and D4 of the respective layers according to refractive indexes of the respective layers.

Figure 12:
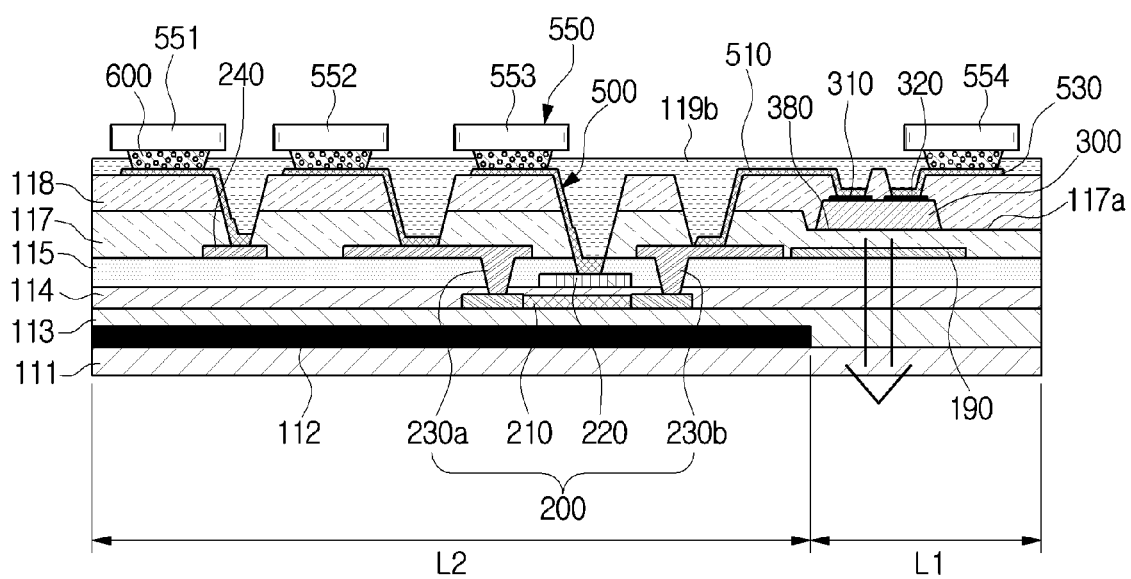
FIG. 12 is a cross-sectional view of one sub-pixel region of a display panel according to another embodiment of the present disclosure.

FIG. 12 is a cross-sectional view of one sub-pixel region of a display panel according to another embodiment of the present disclosure.

Unlike the above-described embodiment, the light emitting diodes 300 disposed in each of the sub-pixel regions SP may be mono LEDs of the same color, and the display panel 110 may include a color conversion layer 190 capable of converting the color of light emitted from the light emitting diode 300. The color conversion layer 190 may be disposed on the interlayer insulating layer 115.

The color conversion layer 190 may contain at least one phosphor converting light emitted from the light emitting diode 300 into light in a different wavelength region.

FIGS. 13 to 17 are plan views and cross-sectional views schematically illustrating pixel regions according to an embodiment of the present disclosure, sequentially illustrating in a manufacturing sequence.

Figure 13:
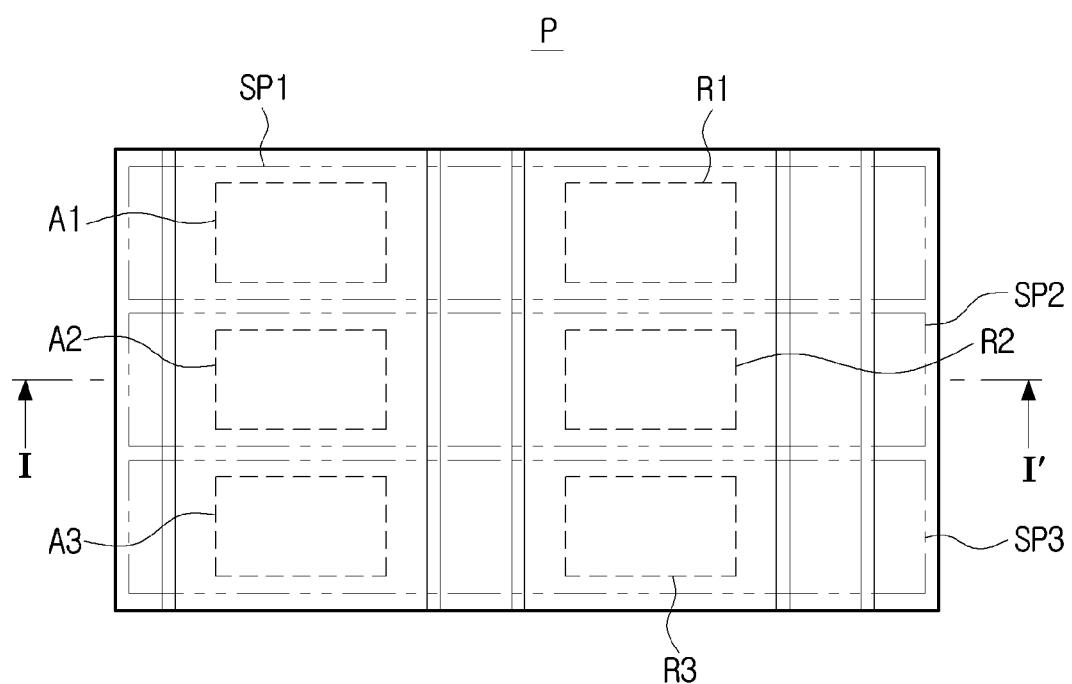
FIGS. 13 to 17 are plan views and cross-sectional views schematically illustrating pixel regions according to an embodiment of the present disclosure, sequentially illustrating in a manufacturing sequence.
Figure 13:
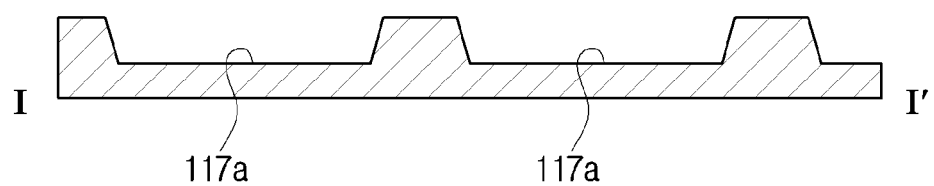

As illustrated in FIG. 13, the pixel region P according to an embodiment of the present disclosure may include three of adjacent sub-pixel regions SP1, SP2, and SP3, and the sub-pixel regions SP1, SP2, and SP3 may include disposition regions A1, A2, and A3 in which the light-emitting diodes are disposed, and repair regions R1, R2, and R3 in which replacement light-emitting diodes to replace the light-emitting diodes when the light-emitting diodes fail to light are disposed. The disposition regions A1, A2, and A3 and the repair regions R1, R2, and R3 may be formed on the concave portion 117a of the first insulating layer 117.

Three of the sub-pixel regions SP1, SP2, and SP3 are arranged in a first direction, and the repair regions R1, R2, and R3 are provided on a second direction perpendicular to the first direction from the disposition regions A1, A2, and A3.

Figure 14:
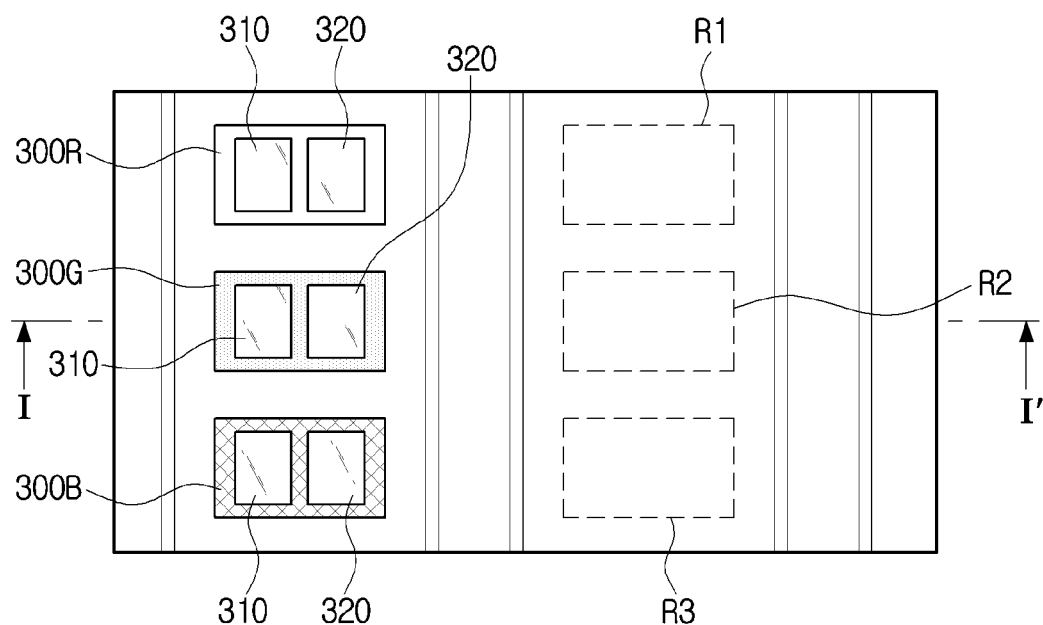
Figure 14:
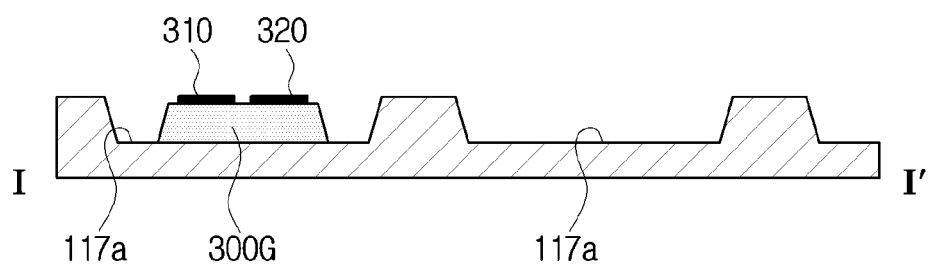

As illustrated in FIG. 14, a red light emitting diode 300R, a green light emitting diode 300G, and a blue light emitting diode 300B may be disposed in three of the disposition regions A1, A2, and A3, respectively.

Figure 15:
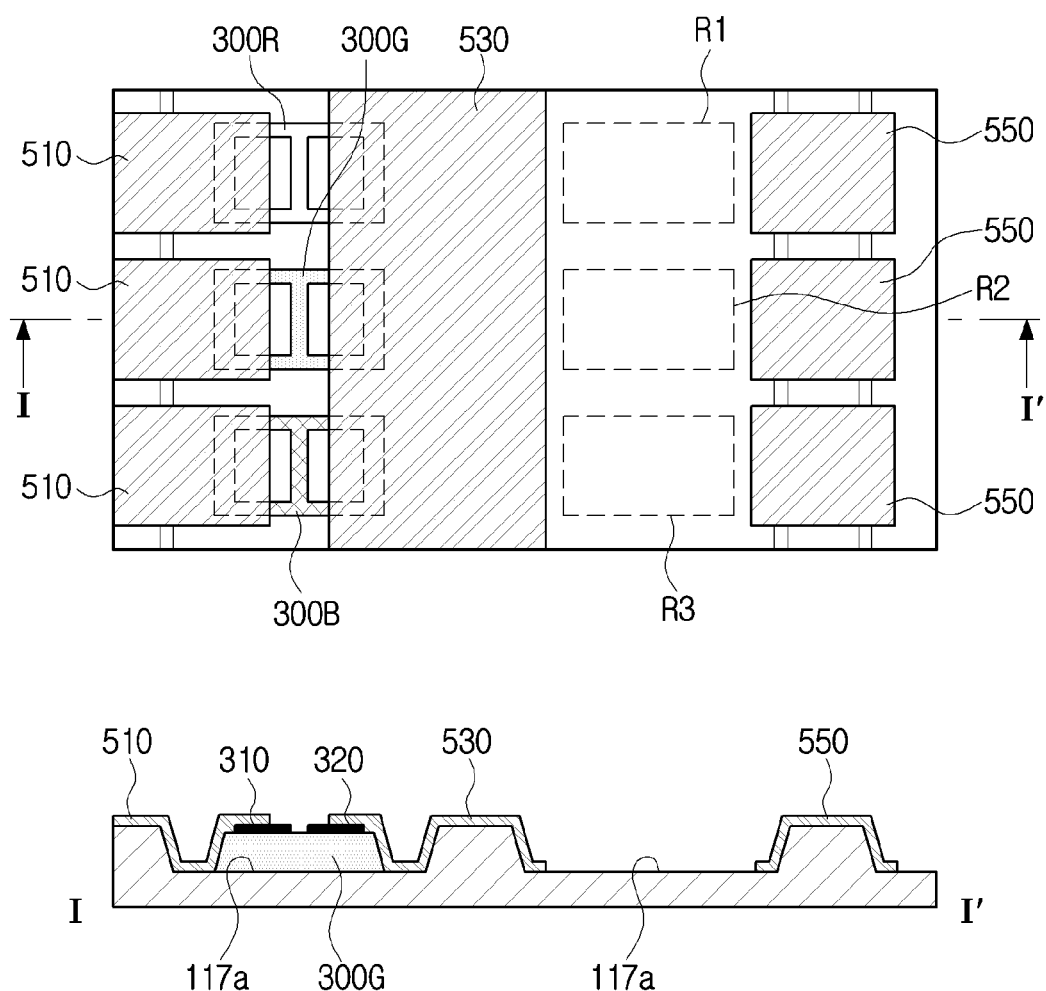

As illustrated in FIG. 15, the signal electrode 510 to supply a data signal to the light emitting diodes 300R, 300G, and 300B disposed, the common ground electrode 530 to provide ground to the light emitting diodes 300R, 300G, 300B and the repair light emitting diode 700 disposed, and a repair signal electrode 550 to supply a signal to the repair light emitting diode 700 may be disposed on the first insulating layer 117. Alternatively, the second insulating layer 118 (FIG. 10, etc.) may be disposed on the first insulating layer 117 to surround the light emitting diodes 300R, 300G, and 300B disposed, and the signal electrode 510, the common ground electrode 530, and the repair signal electrode 550 may be disposed on the second insulating layer 118.

The disposition regions A1, A2, and A3 may be provided between the signal electrode 510 and the common ground electrode 530, and the repair regions R1, R2, and R3 may be provided between the common ground electrode 530 and the repair signal electrode 550.

The signal electrode 510 may be connected to the anode 310 of the light emitting diodes 300R, 300G, and 300B disposed, and the common ground electrode 530 may be connected to the cathode 320 of the light emitting diodes 300R, 300G, and 300B.

After the signal electrode 510, the common ground electrode 530, and the repair signal electrode 550 are formed as described above, the lighting test of the light emitting diodes 300R, 300G, and 300B disposed may be performed.

When the lighting test is successful by emitting light of normal colors from all of the light emitting diodes 300R, 300G, and 300B disposed, the upper insulating layers 119a and 119b (FIG. 10, etc.) are formed and the driver IC chips are bonded.

When the lighting test fails because light of a normal color is not emitted from at least one of the light emitting diodes 300R, 300G, and 300B disposed, a repair light emitting diode to replace the defective light emitting diode is disposed on the substrate.

Figure 16:
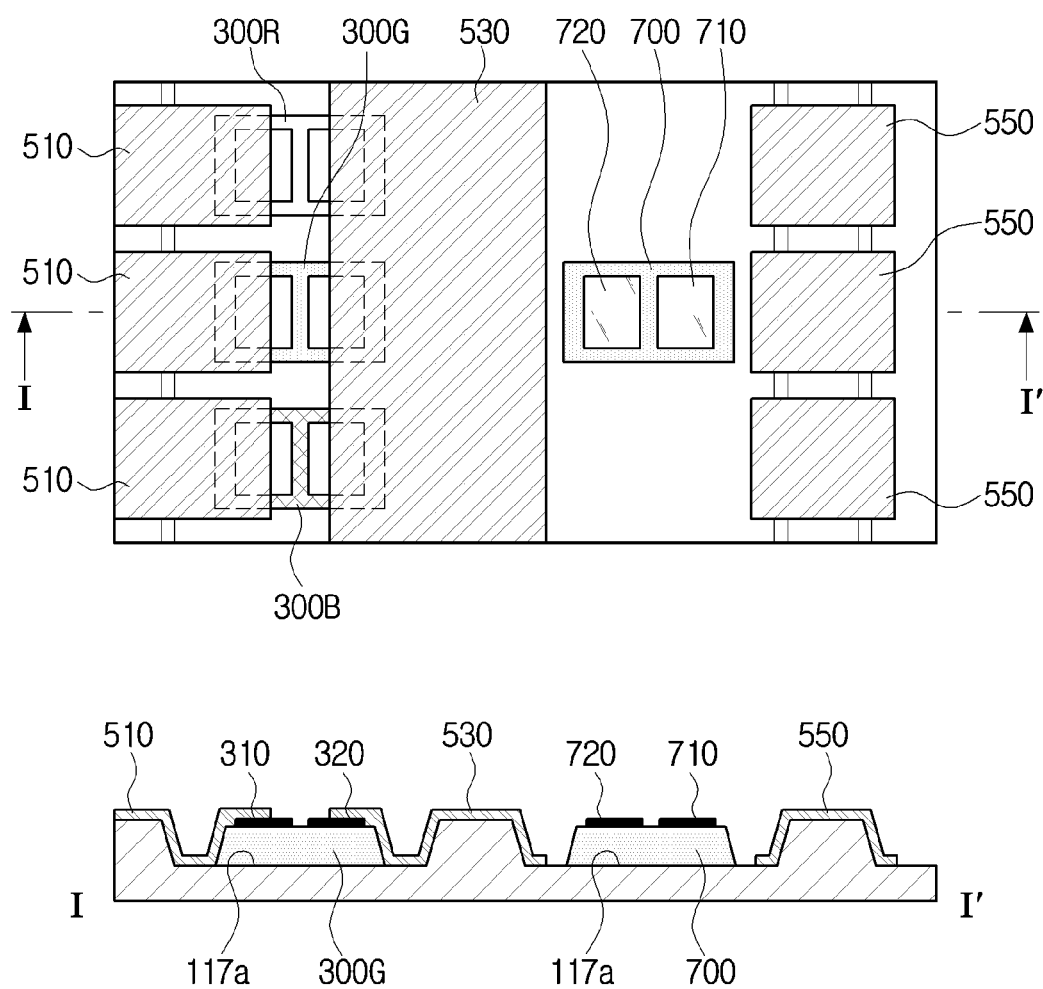
Figure 17:
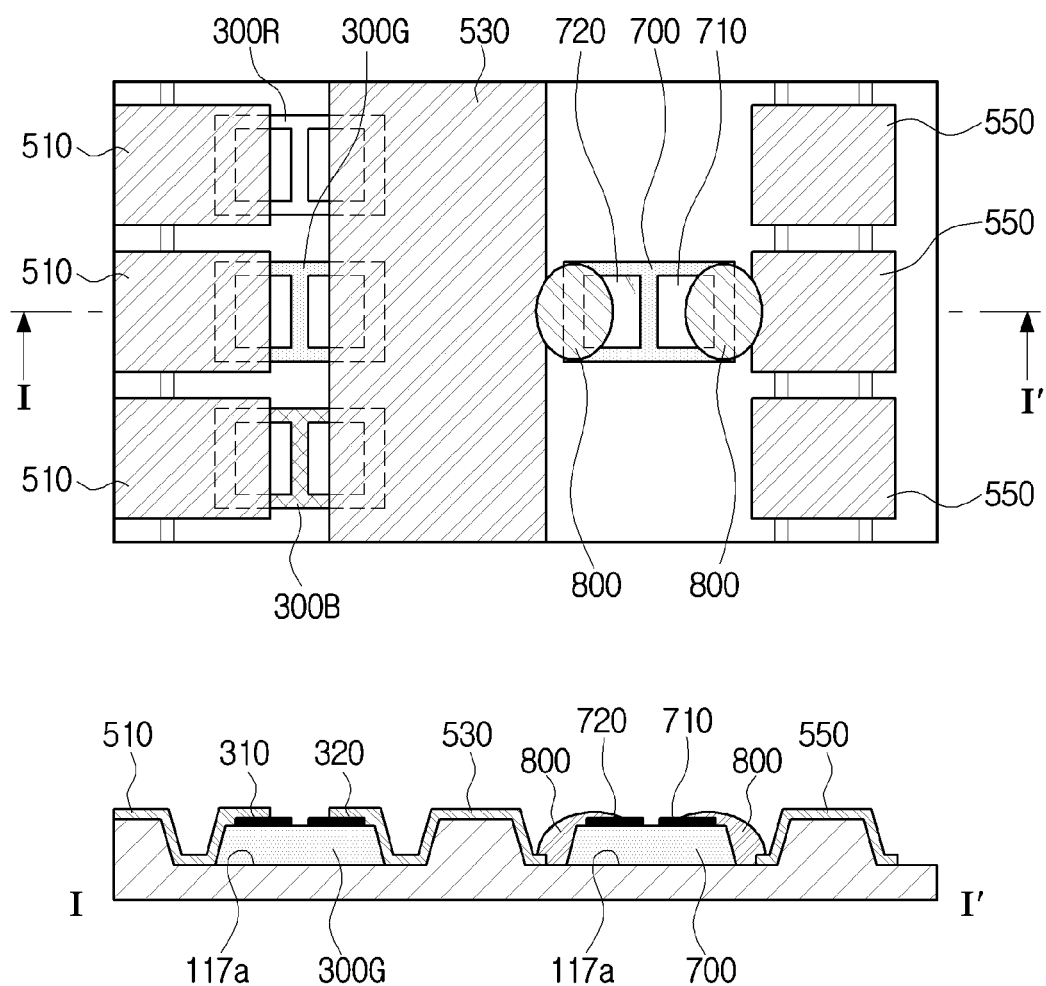

As an example, as illustrated in FIG. 16, when the light emitting diode 300G is not lit, the repair light emitting diode 700 is disposed in the repair region R2. As illustrated in FIG. 17, a metal ink 800 may be filled between the anode 710 of the repair light emitting diode 700 and the repair signal electrode 550 to be electrically connected, and the metal ink 800 may be filled between the cathode 720 of the repair light emitting diode 700 and the common ground electrode 530 to be electrically connected. The metal ink 800, which is a conductive material, may include gold (Au), silver (Ag), copper (Cu), or the like.

The repair light emitting diode 700 is connected to the repair signal electrode 550 and the common ground electrode 530 and then the signal electrode 510 connected to the anode 310 of the defective light emitting diode 300G is cut, so that leakage current generation may be prevented.

Figure 18:
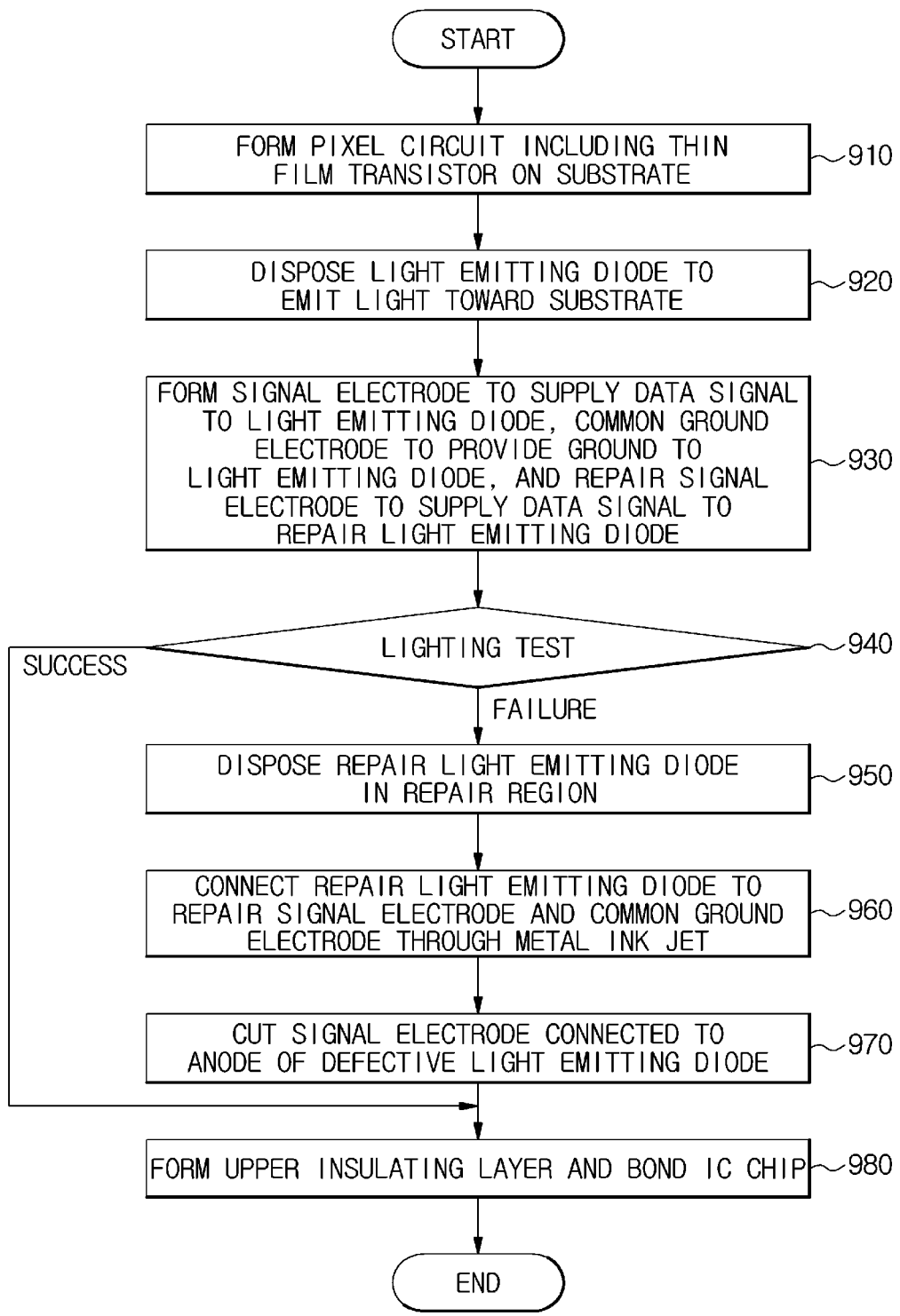
FIG. 18 is a flowchart illustrating a method of manufacturing the display apparatus according to an embodiment of the present disclosure.

FIG. 18 is a flowchart illustrating a method of manufacturing the display apparatus according to an embodiment of the present disclosure.

A method of manufacturing the display apparatus according to an embodiment of the present disclosure will be briefly described with reference to FIGS. 1 to 18.

A pixel circuit including the thin film transistor 200 is formed on the substrate 110 (910), and the light emitting diode 300 of a bottom emission type emitting light toward the substrate 110 is disposed (920).

The upper electrode 500 is formed on the light emitting diode 300. The upper electrode 500 may include the signal electrode 510 to supply a data signal to the light emitting diode 300 disposed, the common ground electrode 530 to provide ground to the light emitting diode 300 disposed and the repair light emitting diode 700, and the repair signal electrode 550 to supply a data signal to the repair light emitting diode 700 (930).

After the upper electrode 500 is formed, a lighting test of the light emitting diode 300 disposed is performed (940).

When the lighting test is successful, the upper insulating layers 119a and 119b are formed on the upper electrode 500, and driver IC chips for driving the display apparatus 100 are bonded on the upper electrode 500 (980).

When the lighting test fails, the repair light emitting diode 700 is disposed in the repair regions R1, R2, and R3 (950), and the metal ink 800 is filled to connect the repair light emitting diode 700 to the repair signal electrode 550 and the common ground electrode 530 (960).

The signal electrode 510 connected to the anode 310 of the defective light emitting diode 300 is cut to break leakage current (970), the upper insulating layers 119a and 119b are formed on the upper electrode 500, and the driver IC chips for driving the display apparatus 100 are bonded on the upper electrode 500 (980).

While the present disclosure has been particularly described with reference to exemplary embodiments, it should be understood by those of skilled in the art that various changes in form and details may be made without departing from the spirit and scope of the present disclosure.

The invention claimed is:

1. A display apparatus comprising:
   a substrate;
   a thin film transistor disposed on the substrate and comprising a semiconductor active layer, a gate electrode, a source electrode, and a drain electrode;
   a first insulating layer disposed on the source electrode and the drain electrode;
   a light emitting diode disposed on the first insulating layer to emit light toward the substrate and comprising a p-n diode, an anode, and a cathode;
   a second insulating layer disposed on the first insulating layer to surround the light emitting diode;
   an upper electrode disposed on the second insulating layer; and
   a driver IC chip disposed above and connected to the upper electrode.

2. The display apparatus according to claim 1, wherein the thin film transistor and the light emitting diode are disposed not to overlap each other.

3. The display apparatus according to claim 1, wherein the substrate comprises a light emitting region in which the light emitting diode is disposed and a non-light emitting region in which the thin film transistor is disposed.

4. The display apparatus according to claim 3, further comprising
   a light absorbing layer disposed in the non-light emitting region.

5. The display apparatus according to claim 1, wherein the gate electrode is disposed above the semiconductor active layer.

6. The display apparatus according to claim 1, wherein the light emitting diode is individually or plurally picked up on a wafer by a transfer mechanism and transferred to the first insulating layer.

7. The display apparatus according to claim 1, wherein the light emitting diode is fixed on the first insulating layer by an adhesive coating.

8. The display apparatus according to claim 1, wherein the light emitting diode comprises a light emitting surface, and the light emitting surface is in contact with the first insulating layer.

9. The display apparatus according to claim 1, wherein the anode and the cathode are positioned on an upper surface of the light emitting diode.

10. The display apparatus according to claim 1, wherein the IC chip is connected to the upper electrode by an ACF bonding.

11. The display apparatus according to claim 1, further comprising
    an upper insulating layer disposed on the upper electrode.

12. A method of manufacturing a display apparatus comprising:
    forming a pixel circuit comprising a thin film transistor on a substrate;
    disposing a light emitting diode on the substrate to emit light toward the substrate;
    forming a signal electrode to supply a data signal to the light emitting diode, a common ground electrode to provide ground to the light emitting diode and a repair light emitting diode, and a repair signal electrode to supply a data signal to the repair light emitting diode; and
    performing a lighting test of the light emitting diode.

13. The method of manufacturing the display apparatus according to claim 12, further comprising
    disposing the repair light emitting diode in a repair region when the lighting test fails.

14. The method of manufacturing the display apparatus according to claim 13, further comprising
    connecting the repair light emitting diode to the repair signal electrode and the common ground electrode through a metal ink.

15. The method of manufacturing the display apparatus according to claim 13, further comprising
    cutting the signal electrode connected to an anode of the light emitting diode that fails to light.

* * * * *